United States Patent
Lin

(10) Patent No.: US 9,007,253 B2
(45) Date of Patent: Apr. 14, 2015

(54) SUCCESSIVE-APPROXIMATION-REGISTER ANALOG-TO-DIGITAL CONVERTER AND METHOD THEREOF

(71) Applicant: Realtek Semiconductor Corp., HsinChu (TW)

(72) Inventor: Chia-Liang Lin, Fremont, CA (US)

(73) Assignee: Realtek Semiconductor Corp., Hsinchu (TW)

(*) Notice: Subject to any disclaimer, the term of this patent is extended or adjusted under 35 U.S.C. 154(b) by 0 days.

(21) Appl. No.: 14/045,821

(22) Filed: Oct. 4, 2013

(65) Prior Publication Data
US 2014/0035767 A1    Feb. 6, 2014

Related U.S. Application Data

(63) Continuation-in-part of application No. 13/706,600, filed on Dec. 6, 2012, now Pat. No. 8,754,798.

(60) Provisional application No. 61/578,246, filed on Dec. 21, 2011.

(51) Int. Cl.
| | |
|---|---|
| *H03M 1/12* | (2006.01) |
| *H03M 1/38* | (2006.01) |
| *H03M 1/14* | (2006.01) |
| *H03M 1/46* | (2006.01) |

(52) U.S. Cl.
CPC .............. *H03M 1/38* (2013.01); *H03M 1/145* (2013.01); *H03M 1/46* (2013.01)

(58) Field of Classification Search
CPC ... H03M 1/468; H03M 1/002; H03M 1/1225; H03M 1/06; H03M 1/1019; H03M 1/12; H03M 1/462; H03M 1/687; H03M 1/1047; H03M 1/1052; H03M 1/34; H03M 1/36; H03M 1/466

USPC .................................. 341/118, 120, 155, 172
See application file for complete search history.

(56) References Cited

U.S. PATENT DOCUMENTS

| | | | | |
|---|---|---|---|---|
| 5,675,340 | A * | 10/1997 | Hester et al. ................... | 341/156 |
| 6,324,850 | B1 * | 12/2001 | Davis ............................. | 62/3.64 |
| 6,603,415 | B1 * | 8/2003 | Somayajula .................. | 341/118 |
| 7,038,609 | B1 * | 5/2006 | Hurrell ......................... | 341/156 |
| 7,265,694 | B2 * | 9/2007 | Guidry .......................... | 341/120 |
| 8,537,046 | B2 * | 9/2013 | Zhao et al. .................... | 341/172 |
| 2005/0219107 | A1 * | 10/2005 | Guidry .......................... | 341/163 |
| 2009/0073018 | A1 * | 3/2009 | Mitikiri ........................ | 341/156 |
| 2009/0091487 | A1 * | 4/2009 | Viswanathan et al. ........ | 341/155 |
| 2009/0261998 | A1 * | 10/2009 | Chae et al. .................... | 341/118 |
| 2011/0148682 | A1 * | 6/2011 | Rigby et al. .................. | 341/155 |
| 2011/0260899 | A1 * | 10/2011 | Snedeker ...................... | 341/118 |
| 2012/0154193 | A1 * | 6/2012 | Chang et al. .................. | 341/156 |
| 2013/0002467 | A1 * | 1/2013 | Wang ............................. | 341/172 |

* cited by examiner

*Primary Examiner* — Linh Nguyen
(74) *Attorney, Agent, or Firm* — McClure, Qualey & Rodack, LLP

(57) ABSTRACT

A main ADC (analog-to-digital converter) for converting an analog input signal into a digital data, and an auxiliary ADC for converting the same analog input signal into an auxiliary digital data, wherein: the main ADC is a successive-approximation-register (SAR) ADC of a first resolution with a first conversion speed; the auxiliary ADC is of a second resolution with a second conversion speed; the second resolution is lower than the first resolution but the second conversion speed is higher than the first conversion speed; and the main ADC generates the digital data by undergoing a process of successive approximation comprising a plurality of steps including a fast-track step that is based on a value of the auxiliary digital data.

12 Claims, 4 Drawing Sheets

| $D_{AUX}$ | $D_8$ | $D_7$ | $D_6$ | $D_5$ |
|---|---|---|---|---|
| 0 | −1 | −1 | −1 | −1 |
| 1 | −1 | −1 | −1 | 1 |
| 2 | −1 | −1 | 1 | −1 |
| 3 | −1 | −1 | 1 | 1 |
| 4 | −1 | 1 | −1 | −1 |
| 5 | −1 | 1 | −1 | 1 |
| 6 | −1 | 1 | 1 | −1 |
| 7 | −1 | 1 | 1 | 1 |
| 8 | 1 | −1 | −1 | −1 |
| 9 | 1 | −1 | −1 | 1 |
| 10 | 1 | −1 | 1 | −1 |
| 11 | 1 | −1 | 1 | 1 |
| 12 | 1 | 1 | −1 | −1 |
| 13 | 1 | 1 | −1 | 1 |
| 14 | 1 | 1 | 1 | −1 |
| 15 | 1 | 1 | 1 | 1 |

SUCCESSIVE-APPROXIMATION-REGISTER ANALOG-TO-DIGITAL CONVERTER AND METHOD THEREOF

CROSS-REFERENCE TO RELATED APPLICATION

This application is a continuation-in-part of U.S. application Ser. No. 13/706,600, filed Dec. 6, 2012, which claims priority to U.S. provisional application 61/578,246, filed Dec. 21, 2011. The contents of these applications are incorporated herein by reference.

FIELD OF TECHNOLOGY

This disclosure relates to successive-approximation-register analog-to-digital converter.

BACKGROUND

Successive-Approximation-Register (SAR) analog-to-digital converters (ADC) are widely used in many applications. A SAR ADC converts an analog input signal into a digital output data and comprises a SAR controller for successive approximation and a DAC (digital-to-analog converter) for converting a digital code into a voltage. It is difficult to make a high resolution conversion for an SAR ADC, because doing so generally requires using a high resolution DAC. This typically requires more steps of successive approximation for updating the digital code and therefore limits the conversion speed of SAR ADC, as it takes longer to finish the successive approximation. In brief, it is difficult to achieve both high resolution conversion and high conversion speed in a given device.

Accordingly, it is desired to provide an apparatus and method providing a SAR ADC with an acceptable balance between conversion speed and resolution

SUMMARY

The present invention discloses a method allowing a SAR ADC with an acceptable balance between conversion speed and resolution.

In an embodiment, an apparatus comprises: a main ADC (analog-to-digital converter) for converting an analog input signal into a digital data, and an auxiliary ADC for converting the same analog input signal into an auxiliary digital data, wherein: the main ADC is a successive-approximation-register (SAR) ADC of a first resolution with a first conversion speed; the auxiliary ADC is of a second resolution with a second conversion speed; the second resolution is lower than the first resolution but the second conversion speed is higher than the first conversion speed; and the main ADC generates the digital data by undergoing a process of successive approximation comprising a plurality of steps including a fast-track step that is based on a value of the auxiliary digital data.

In another embodiment, a method comprises: receiving an analog input signal; sampling the analog input signal into a first voltage; generating a second voltage using a digital-to-analog converter in accordance with a digital code; going through a process of successive approximation comprising a plurality of steps to successively update the digital code to make the second voltage approach the first voltage in accordance with a polarity of a difference between the first voltage and the second voltage; and bypassing at least one step of said plurality of steps by directly updating the digital code in accordance with an output of an auxiliary analog-to-digital converter.

In an embodiment, a higher resolution but lower speed SAR ADC utilizes a lower resolution but higher speed auxiliary ADC to bootstrap a process of successive approximation it undergoes to successively approximate a sampled analog input signal.

In an embodiment, a method comprises: simultaneously performing a higher resolution but lower speed analog-to-digital conversion and a lower resolution but higher speed analog-to-digital conversion, wherein the higher resolution but lower speed analog-to-digital conversion is based on a process of successive approximation comprising a plurality of steps; and utilizing a result of the lower resolution but higher speed analog-to-digital conversion to speed up the process of successive approximation by bypassing at least one of said plurality of steps.

BRIEF DESCRIPTION OF THE DRAWINGS

FIG. 4 shows a logic table for the main ADC of FIG. 1 to utilize an output of the auxiliary ADC.

DETAILED DESCRIPTION

The following detailed description refers to the accompanying drawings which show, by way of illustration, various embodiments in which the invention may be practiced. These embodiments are described in sufficient detail to enable those skilled in the art to practice these and other embodiments. The various embodiments are not necessarily mutually exclusive, as some embodiments can be combined with one or more other embodiments to form new embodiments. The following detailed description is, therefore, not to be taken in a limiting sense.

Figure 1:
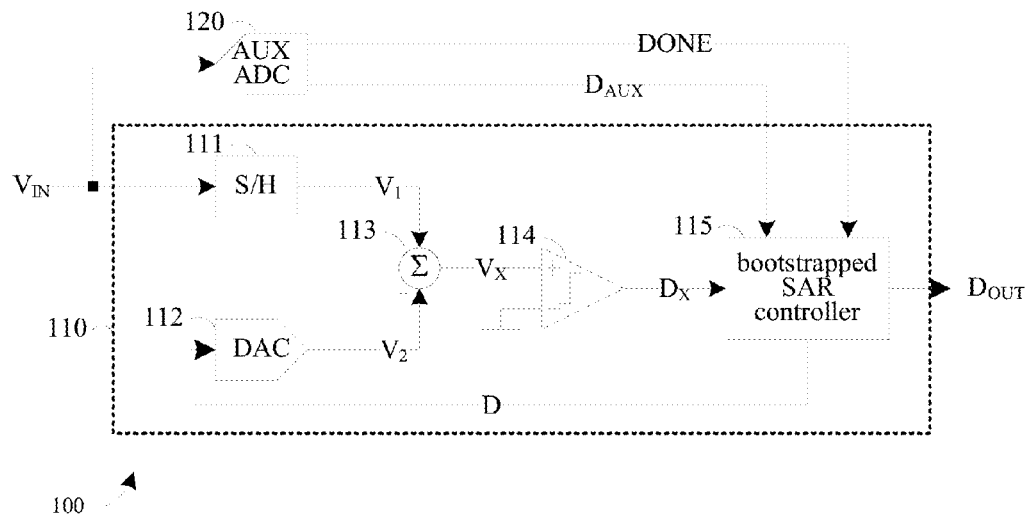
FIG. 1 shows a schematic diagram of a SAR ADC comprising a main ADC and an auxiliary ADC in accordance with an embodiment of the present invention.

A functional block diagram of an ADC 100 in accordance with an embodiment of the present invention is depicted in FIG. 1. ADC 100 comprises a main ADC 110 and an auxiliary ADC 120. The main ADC 110 receives an analog input signal $V_{IN}$ and outputs digital data $D_{OUT}$. The auxiliary ADC 120 also receives the same analog input signal $V_{IN}$, but outputs an auxiliary digital data $D_{AUX}$ and a logical signal DONE signaling that an analog-to-digital conversion is completed. The auxiliary digital data $D_{AUX}$ from the auxiliary ADC 120 is provided to the main ADC 110 to bootstrap the analog-to-digital conversion of the main ADC 110. Both the digital data $D_{OUT}$ from the main ADC 110 and the auxiliary digital data $D_{AUX}$ from the auxiliary ADC 120 are digital representations of the common analog input signal $V_{IN}$. However, their respective resolutions of analog-to-digital conversion are different. Specifically, the resolution of the auxiliary ADC 120 is lower than that of the main ADC 110. Since the resolution of the auxiliary ADC 120 is lower, it can complete the analog-to-digital conversion faster than the main ADC 110. After the auxiliary ADC 120 finishes the analog-to-digital conversion, it asserts the logical signal DONE and provides the auxiliary digital data $D_{AUX}$ to the main ADC 110 as a rough estimate of the digital data $D_{OUT}$, allowing the main ADC 110 to bypass unnecessary conversion steps and thus increasing the overall conversion speed.

The main ADC 110 is a SAR ADC. The main ADC 110 comprises: a S/H (sample-and-hold) circuit 111 for sampling the analog input signal $V_{IN}$ into a first voltage $V_1$; a DAC (digital-to-analog converter) 112 for converting a digital code D into a second voltage $V_2$; a summing circuit 113 for generating a third voltage $V_X$ representing a difference between the first voltage $V_1$ and the second voltage $V_2$; a comparator 114 for generating a decision $D_X$ based on a result of detecting a polarity of the third voltage $V_X$ (i.e., comparing the third voltage $V_X$ with a ground level); and a bootstrapped SAR controller 115 for receiving the decision $D_X$, the auxiliary digital data $D_{AUX}$, and the logical signal DONE, going through a successive approximation process to successively update the digital code D to make the second voltage $V_2$ successively approach the first voltage $V_1$ in accordance with the decision $D_X$, the auxiliary digital data $D_{AUX}$, and the logical signal DONE, and generating the digital data $D_{OUT}$ based on a final value of the digital code D at the end of the successive approximation. During the process of successive approximation, upon assertion of the logical signal DONE, the bootstrapped SAR controller 115 uses the auxiliary digital data $D_{AUX}$ to directly update the digital code D, bypassing at least one successive approximation step that is otherwise needed.

Figure 2:
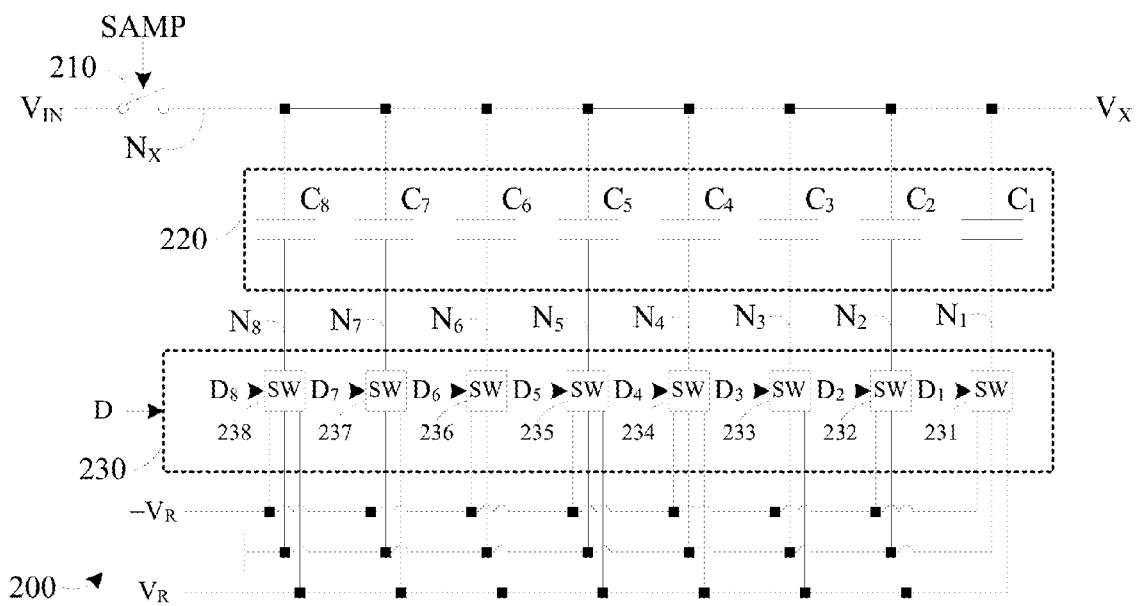
FIG. 2 shows an embodiment a circuit embodying a combination of the functions of the sample-and-hold circuit, the DAC, and the summing circuit for the main ADC of FIG. 1.

In an embodiment, the functions of the sample-and-hold circuit 111, DAC 112, and summing circuit 113 are combined and embodied by a circuit 200 depicted in FIG. 2. Circuit 200 comprises a sampling switch 210, a capacitor array 220, and a DAC switch network 230. By way of example but not limitation, the capacitor array 220 comprises eight capacitors labeled as $C_1$~$C_8$. Each of the eight capacitors $C_1$~$C_8$ has a top plate and a bottom plate; the top plate is connected to a common circuit node $N_X$; the bottom plate is connected to a respective internal circuit node. For instance, the bottom plates of capacitor $C_1$, $C_2$, $C_3$, . . . , and $C_8$ are connected to internal circuit node $N_1$, $N_2$, $N_3$, . . . , and $N_8$, respectively. The DAC switch network 230 comprises eight DAC switches (denoted as SW in the figure) labeled as 231~238, one for each of the eight capacitors $C_1$~$C_8$. For instance, DAC switch 231, 232, 233, . . . , and 238 are for capacitor $C_1$, $C_2$, $C_3$, . . . , and $C_8$, respectively. The digital code D is a collection of eight sub-codes labeled as $D_1$~$D_8$, one for controlling each of the eight DAC switches 231~238. For instance, sub-codes $D_1$, $D_2$, $D_3$, . . . , and $D_8$ are for controlling switches 231, 232, 233, . . . , and 238, respectively. In an embodiment, each of the eight sub-codes $D_1$~$D_8$ has three possible values: −1, 0, 1; when the value of the sub-code is 0, the corresponding DAC switch connects the corresponding internal circuit node to ground; when the value of the sub-code is 1, the corresponding DAC switch connects the corresponding internal circuit node to a negative reference voltage $-V_R$; and when the value of the sub-code is −1, the corresponding DAC switch connects the corresponding internal circuit node to a positive reference voltage $V_R$. For instance, when the value of sub-code $D_1$ ($D_2$, $D_3$, . . . , $D_8$) is 0, DAC switch 231 (232, 233, . . . , 238) connects internal circuit node $N_1$ ($N_2$, $N_3$, . . . , $N_8$) to ground; when the value of the sub-code $D_1$ ($D_2$, $D_3$, . . . , $D_8$) is 1, DAC switch 231 (232, 233, . . . , 238) connects internal circuit node $N_1$ ($N_2$, $N_3$, . . . , $N_8$) to the negative reference voltage $-V_R$; and when the value of the sub-code $D_1$ ($D_2$, $D_3$, . . . , $D_8$) is −1, DAC switch 231 (232, 233, . . . , 238) connects internal circuit node $N_1$ ($N_2$, $N_3$, . . . , $N_8$) to the positive reference voltage $V_R$. At the beginning of an analog-to-digital conversion (of the main ADC 110 of FIG. 1, which utilizes circuit 300 of FIG. 3), all sub-codes ($D_1$~$D_8$) are reset to 0, and therefore, all internal circuit nodes $N_1$~$N_8$ are connected to ground. During a sampling period (where a sampling signal SAMP is asserted), the common circuit node $N_X$ is coupled to the analog input signal $V_{IN}$ via the sampling switch 210; this causes the analog input signal $V_{IN}$ to be sampled onto capacitors $C_1$~$C_8$. Upon de-assertion of the sampling signal SAMP, the sampling switch 210 is open and a level of the analog input signal $V_{IN}$ is held and stored as charges on capacitors $C_1$~$C_8$; this effectively embodies the function of the sample-and-hold circuit 111 of FIG. 1, i.e., the first voltage $V_1$ of FIG. 1 is implied and stored onto capacitors $C_1$~$C_8$. During the successive approximation process, the sub-codes $D_8$, $D_7$, $D_6$, . . . , $D_1$, are successively updated depending on a value of the decision $D_X$ (see FIG. 1), so that the internal circuit nodes $N_8$, $N_7$, $N_6$, . . . , $N_1$, are conditionally switched to connect to either $V_{R+}$ or $V_{R-}$; this effectively embodies the function of DAC 112 of FIG. 1; and the second voltage $V_2$ of FIG. 1 is implied and stored onto capacitors $C_1$~$C_8$. Since both the first voltage $V_1$ and the second voltage $V_2$ are implied and stored onto capacitors $C_1$~$C_8$, they are implicitly summed and therefore the function of the summing circuit 113 of FIG. 1 is effectively embodied; and the voltage potential at the common node $N_X$, i.e. $V_X$, embodies the output of the summing circuit 113 of FIG. 1.

Refer back to FIG. 1. An objective of the present invention is to use the auxiliary ADC 120 to speed up the conversion of the main ADC 110. To fulfill this objective, the auxiliary ADC 120 must perform its analog-to-digital conversion faster than the main ADC 110.

Figure 3:
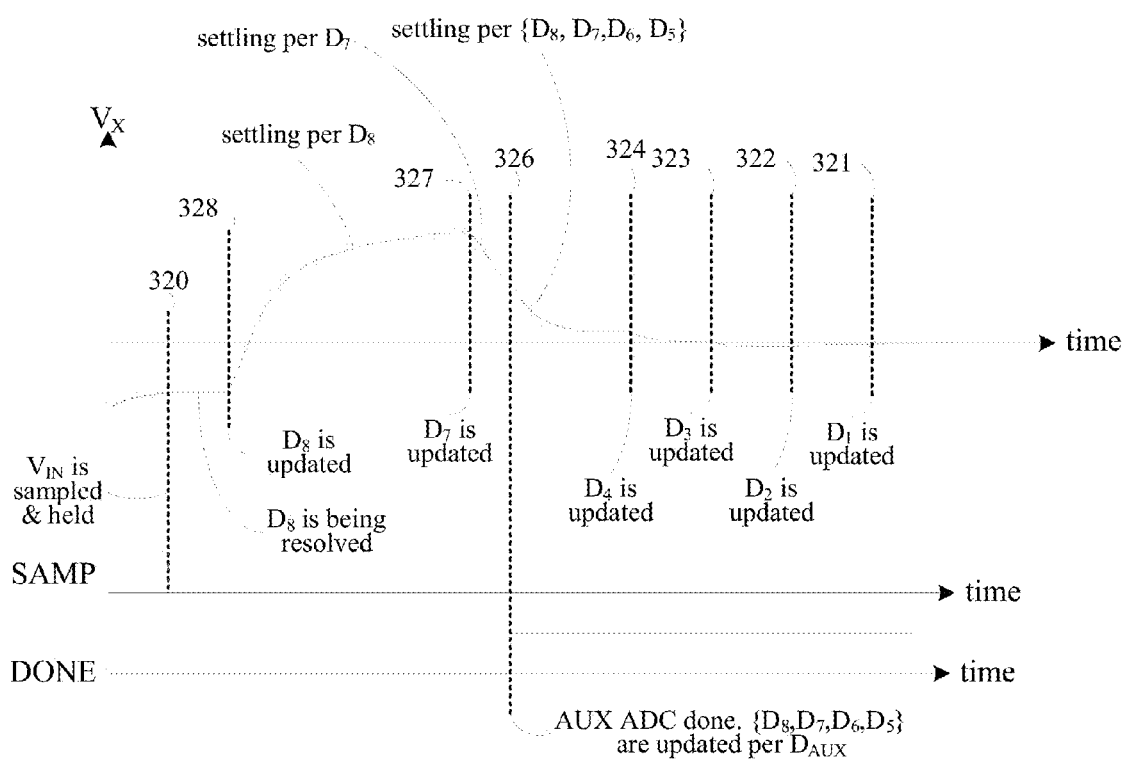
FIG. 3 shows an exemplary waveform for the circuit of FIG. 2 in a typical case where the main ADC receives help from the auxiliary ADC.

In an exemplary embodiment of the present invention, the auxiliary ADC 120 is an ADC that has a lower resolution than the main ADC 110. For example, a lower resolution ADC using smaller capacitors to speed up both comparison and settling can be faster than a higher resolution ADC. The auxiliary ADC 120 has lower resolution than the main ADC 110 but is faster than the main ADC 110 so that the logical signal DONE is asserted before the main ADC 110 finishes the conversion. In an exemplary embodiment, the auxiliary ADC 120 is a 4-bit ADC, and thus its resolution is similar to the four most significant bits of the main ADC 110. That is, $D_{AUX}$ is a good estimate for $\{D_8, D_7, D_6, D_5\}$, which is the four most significant bits for the main ADC 110. An exemplary waveform for this case is depicted in FIG. 3. Refer to FIG. 3, FIG. 1, and FIG. 2. During the sampling period where SAMP is asserted, $V_2$ is implicitly zero, $V_1$ implicitly tracks $V_{IN}$ (and so does $V_X$). At time instant 320 where SAMP is de-asserted, $V_1$ is implicitly held, and so is $V_X$. Then, a polarity of $V_X$ is being resolved, and so is $D_8$. At time instant 328, $D_8$ is resolved as −1 (because $V_X$ is negative) and updated, causing SW 238 to connect $N_8$ to $V_R$ (see FIG. 2) and thus making $V_X$ higher. After $V_X$ settles per the value of $D_8$, the polarity of $V_X$ is being resolved, and so is $D_7$. At time instant 327, $D_7$ is resolved as 1 (because $V_X$ is positive) and updated, causing SW 237 to connect $N_7$ to $-V_R$ (see FIG. 2) and thus making $V_X$ lower. During the settling per the value of $D_7$, the auxiliary ADC 120 finishes its analog-to-digital conversion. At time instant 326, the logical signal DONE is asserted and a value of the auxiliary data $D_{AUX}$ is available. At this moment, only $D_8$ and $D_7$ have been resolved; however, now that $D_{AUX}$ (which is a good estimate for $\{D_8, D_7, D_6, D_5\}$) is available, one can directly use $D_{AUX}$ to update $\{D_8, D_7, D_6, D_5\}$. That is, one bypasses the steps for resolving $D_6$ and $D_5$, which are otherwise needed if the auxiliary ADC 120 is either not present or irrelevant, and replaces them with a "fast-track"

step that is based on a value of the auxiliary data $D_{AUX}$. In an embodiment, the bootstrapped SAR controller 115 comprises and uses the table shown in FIG. 4 to update $\{D_8, D_7, D_6, D_5\}$ per the value of $D_{AUX}$ (which is a 4-bit number between 0 and 15, inclusive). In an alternative embodiment, $\{D_8, D_7, D_6, D_5\}$ is not strictly mapped in accordance with the table in FIG. 4 if there is a conflict between the table and the values that have already been resolved in the successive approximation process (that is, $\{D_8, D_7\}$, in the aforementioned example); when the conflict is detected, the values that have already been resolved will be preserved, while the rest (that is, $\{D_6, D_5\}$, in the aforementioned example) are updated so as to minimize the discrepancy between $D_{AUX}$ and $\{D_8, D_7, D_6, D_5\}$. For instance, if $\{D_8, D_7\}$ has been resolved as $\{-1, 1\}$ but $D_{AUX}$ is 8 (which according to the table in FIG. 5 should be mapped to $\{D_8, D_7, D_6, D_5\} = \{1, -1, -1, -1\}$), then we will preserve $\{D_8, D_7\}$ as is $\{-1, 1\}$ but update $\{D_6, D_5\}$ to $\{1, 1\}$, i.e. we set $\{D_8, D_7, D_6, D_5\}$ to $\{-1, 1, 1, 1\}$, which is the closest match to $D_{AUX}=8$ without changing the already resolved values of $\{D_8, D_7\}$. Although the discrepancy (between $D_{AUX}$ and the most significant bit (bits) that has (have) been resolved by the main ADC 110) might cause an error to the output data $D_{OUT}$, the error can be tolerated and corrected as long as a redundancy is used and implemented among the less significant bits of the main ADC 110 (i.e., $D_1 \sim D_4$ and correspondingly $C_1 \sim C_4$ in the aforementioned example of FIG. 2). The principle of using redundancy in less significant bits to correct an error in a more significant bit is well known in prior art and thus need not be described in detail here.

Figure 5:
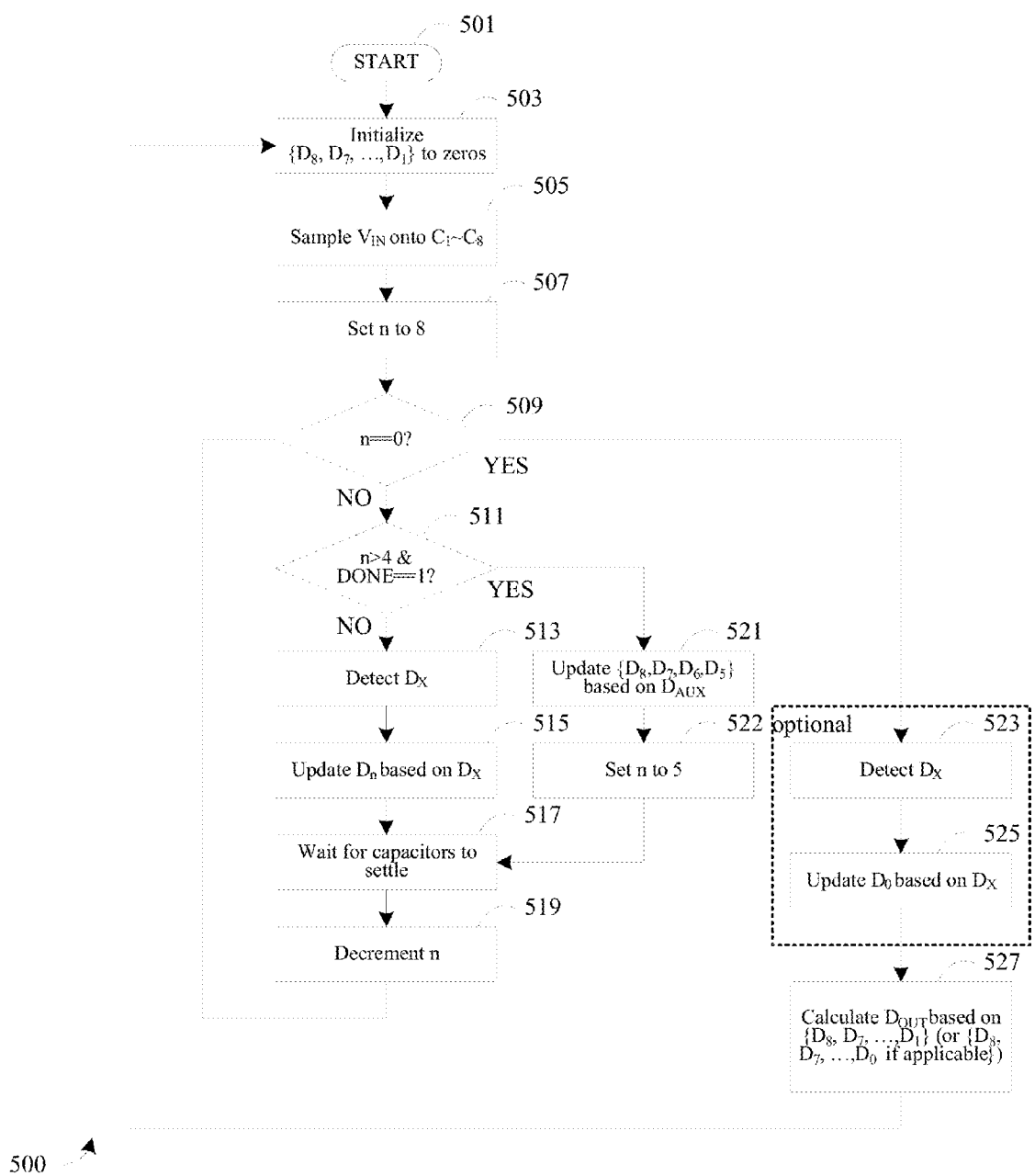
FIG. 5 shows a flow chart illustrating operations of the main ADC of FIG. 1.

The bootstrapped SAR controller 115 of FIG. 1 is a finite state machine. An exemplary flow chart 500 for embodying a function of the bootstrapped SAR controller 115 of FIG. 1 is depicted in FIG. 5. After the ADC is started (step 501), it initializes the digital code D, i.e. setting $\{D_8, D_7, \ldots, D_1\}$ to all zeros (step 503); then it samples the analog input signal $V_{IN}$ onto capacitors $C_1 \sim C_8$ (e.g., by asserting and then de-asserting SAMP, see FIG. 2) (step 505); then it commences a process of successive approximation by setting an internal variable n to 8 (which is the number of capacitors it uses) (step 507); then it checks if the value of the internal variable n is 0 (step 509); if n is not 0, indicating the process of successive approximation is not finished yet, it checks if n is greater than 4 and also the logical signal DONE is asserted (step 511): if n is not greater than 4 or the logical signal DONE is not asserted, it detects the polarity of $D_X$ (step 513), and updates $D_n$ based on the polarity of $D_X$ (step 515); if n is greater than 4 and also the logical signal DONE is asserted, it directly updates $\{D_8, D_7, D_6, D_5\}$ based on $D_{AUX}$ (step 521), and sets n to 5 (step 522), indicating that $D_5$ has been updated; after either the update of $D_n$ (step 515) or $\{D_8, D_7, D_6, D_5\}$ (step 522), it waits for capacitors $C_1 \sim C_8$ to settle (step 517); then it decrements the internal variable n (step 519); then it loops back to check if n is 0 (step 509); if n is 0, indicating the process of successive approximation is done; then it proceeds to calculate the value of the digital data $D_{OUT}$ based on $\{D_8, D_7, D_6, \ldots, D_1\}$ (step 527); then it moves on to perform next analog-to-digital conversion by looping back to step 503. In an optional embodiment, if n is 0 in step 509, it performs one more detection for $D_X$ (step 523), and then updates an additional sub-code $D_0$ accordingly (step 525). In this optional embodiment, the value of $D_0$ will be included in calculating the digital data $D_{OUT}$. In one embodiment, the digital data DOUT is calculated according to the following formula:

$$D_{OUT} = D_0/2 + \Sigma_{n=1}^{8} D_n C_n / C_1 \quad (1)$$

That is, the weight of sub-code $D_n$ is determined by the weight of the capacitor whose connectivity the sub-code controls, and the weight of the additional sub-code $D_0$ is set to ½. If the optional steps 523 and 525 are not used, then the value of additional sub-code $D_0$ for equation (1) is set to 0.

The auxiliary ADC 120 of FIG. 1 can be embodied by whatever ADC as long as it can finish the analog-to-digital before the main ADC 110 finishes resolving the most significant bits that the auxiliary ADC 120 is intended to be used to help resolving. When the auxiliary ADC 120 starts an analog-to-digital conversion, the logical signal DONE is de-asserted; when the auxiliary ADC 120 finishes the analog-to-digital conversion, the logical signal DONE is asserted.

In one embodiment, the auxiliary ADC 120 is a flash ADC.

In one embodiment, the auxiliary ADC 120 also a SAR ADC. In one embodiment, the auxiliary ADC 120 also comprises the circuit 200 shown in FIG. 2, but with smaller capacitors and fewer capacitors (so that the analog-to-digital conversion can be finished faster).

In one embodiment, the auxiliary ADC 120 performs a sample-and-hold function slightly earlier than main ADC 110 does so as to finish its conversion earlier.

Although specific embodiments have been illustrated and described herein, it will be appreciated by those of ordinary skill in the art that any arrangement that is calculated to achieve the same purpose may be substituted for the specific embodiments shown. This application is intended to cover adaptations and variations of the embodiments discussed herein. Various embodiments use permutations and/or combinations of embodiments described herein. It is to be understood that the above description is intended to be illustrative, and not restrictive, and that the phraseology or terminology employed herein is for the purpose of description.

The invention claimed is:

1. An analog-to-digital conversion apparatus, comprising:
   a first ADC (analog-to-digital converter) having a first resolution and a first conversion speed, for converting an analog input signal into a first digital signal, based in part on a value of a second digital signal provided to the first ADC, the first ADC comprising:
     a bootstrapped controller, for updating a digital code according to a decision signal and the second digital signal and generating the first digital signal based on a final value of the digital code at an end of a first process;
     a S/H (sample-and-hold) circuit configured to sample the analog input signal into a first voltage;
     a DAC (digital-to-analog converter) for converting the digital code into a second voltage;
     a summing circuit configured to generate a third voltage having a magnitude equal to a difference between the first voltage and the second voltage; and
     a comparator configured to generate the decision signal based on a polarity of the third voltage; and
   a second ADC of a second resolution and a second conversion speed, for converting the analog input signal into the second digital signal;
   wherein the second resolution is lower than the first resolution and the second conversion speed is higher than the first conversion speed.

2. The apparatus of claim 1, wherein the comparator compares the third voltage with a ground level to generate the decision signal.

3. The apparatus of claim 1, wherein the second digital signal comprises a third digital signal and a fourth digital signal, and the bootstrapped controller uses the fourth digital signal to directly update the digital code upon assertion of the third digital signal, bypassing at least one step of resolving at least a bit of the digital code.

4. The apparatus of claim 3, wherein the bootstrapped SAR controller uses the fourth digital signal to directly update the digital code based on a value of a table.

5. The apparatus of claim 1, wherein the bootstrapped SAR controller comprises a finite state machine.

6. The apparatus of claim 1, wherein the second ADC is a flash ADC.

7. The apparatus of claim 1, wherein the second ADC is a SAR ADC.

8. A method of analog-to-digital conversion comprises:
converting an analog input signal into a first digital signal with a first ADC having a first resolution and a first conversion speed;
converting the analog input signal into a second digital signal with a second ADC of a second resolution and a second conversion speed;
updating a digital code according to a decision signal and the second digital signal;
generating the first digital signal based on a final value of the digital code at an end of the first process;
sampling the analog input signal into a first voltage with a S/H (sample-and-hold) circuit;
converting the digital code into a second voltage with a DAC (digital-to-analog converter);
generating a third voltage representing a difference between the first voltage and the second voltage with a summing circuit; and
generating the decision signal based on a polarity of the third voltage with a comparator; and
going through a first process, the first process comprising a step being based on a value of the second digital signal provided to the first ADC;
wherein the second resolution is lower than the first resolution and the second conversion speed is higher than the first conversion speed.

9. The method of claim 8, comprising:
comparing the third voltage with a ground level to generate the decision signal.

10. The method of claim 8, wherein the second digital signal comprises a third digital signal and a fourth digital signal, comprising:
using the fourth digital signal to directly update the digital code upon assertion of the third digital signal; and
bypassing at least one step of resolving at least a bit of the digital code in the first process.

11. The method of claim 10, comprising:
using the fourth digital signal to directly update the digital code based on a value of a table.

12. A method of analog-to-digital conversion comprises:
receiving an analog input signal;
sampling the analog input signal to generate a first voltage;
generating a second voltage using a digital-to-analog converter in accordance with a digital code;
successively updating the digital code to cause the second voltage to approach the first voltage in accordance with a polarity of a difference between the first voltage and the second voltage; and
bypassing the step of successively updating the digital code by directly updating the digital code in accordance with an output of an auxiliary analog-to-digital converter.

* * * * *